United States Patent
Dings

(10) Patent No.: US 6,288,366 B1
(45) Date of Patent: Sep. 11, 2001

(54) FURNACE FOR THE PRODUCTION OF SOLAR CELLS

(75) Inventor: Franciscus Cornelis Dings, Veldhoven (NL)

(73) Assignee: OTB Group B.V., Eindhoven (NL)

( * ) Notice: Subject to any disclaimer, the term of this patent is extended or adjusted under 35 U.S.C. 154(b) by 0 days.

(21) Appl. No.: 09/466,187

(22) Filed: Dec. 17, 1999

(30) Foreign Application Priority Data

Dec. 17, 1998 (NL) .................................................. 1010836

(51) Int. Cl.$^7$ ....................................................... F27B 9/06
(52) U.S. Cl. ........................... 219/388; 219/521; 34/500; 34/216; 34/236
(58) Field of Search ......................... 219/388, 521; 392/417; 432/9, 11, 123, 128, 143, 146, 147, 243; 34/266, 273, 420, 451, 498, 500, 614, 658, 659, 661, 664, 216, 217, 236, 245

(56) References Cited

U.S. PATENT DOCUMENTS

| | | |
|---|---|---|
| 3,452,408 | 7/1969 | Bossetti . |
| 3,662,512 * | 5/1972 | Zelnick ................................. 219/388 |
| 3,881,089 * | 4/1975 | Harkness et al. ..................... 219/388 |
| 4,169,007 * | 9/1979 | Pray ..................................... 219/388 |
| 4,473,004 * | 9/1984 | Wells et al. .......................... 219/388 |
| 4,479,776 * | 10/1984 | Smith ................................... 219/388 |
| 4,517,448 * | 5/1985 | Crain et al. .......................... 219/388 |
| 4,526,537 | 7/1985 | Rumbach . |
| 4,554,437 * | 11/1985 | Wagner et al. ...................... 219/388 |
| 4,565,917 * | 1/1986 | Furtek .................................. 219/388 |
| 4,833,301 * | 5/1989 | Furtek .................................. 219/388 |
| 5,044,920 | 9/1991 | Gerlach . |
| 5,046,264 * | 9/1991 | Hultzsch et al. ....................... 34/245 |
| 5,180,898 * | 1/1993 | Alden et al. ......................... 219/388 |
| 5,196,676 * | 3/1993 | Hallahan ............................... 219/388 |
| 5,239,917 * | 8/1993 | Lutkie et al. ........................ 219/388 |
| 5,289,759 * | 3/1994 | Hufford ................................ 219/388 |
| 5,423,248 * | 6/1995 | Smith et al. ......................... 219/388 |
| 5,440,101 * | 8/1995 | Cox et al. ............................ 219/388 |
| 5,440,102 * | 8/1995 | Pena ..................................... 219/388 |
| 5,449,883 * | 9/1995 | Tsuruta ................................. 219/388 |
| 5,553,532 * | 9/1996 | de la Luz-Martinez ............. 219/388 |
| 5,665,257 * | 9/1997 | Svendsen ............................. 219/388 |
| 5,942,142 * | 8/1999 | Forney et al. ....................... 219/388 |

FOREIGN PATENT DOCUMENTS

| | | |
|---|---|---|
| 38 22 883 | 1/1990 | (DE) . |
| 92 05 956 | 9/1992 | (DE) . |
| 42 18 705 | 2/1994 | (DE) . |
| 0 437 913 | 7/1991 | (EP) . |
| 2 607 232 | 5/1988 | (FR) . |

* cited by examiner

*Primary Examiner*—Teresa Walberg
*Assistant Examiner*—Fadi H. Dahbour
(74) *Attorney, Agent, or Firm*—Young & Thompson

(57) ABSTRACT

A furnace for heating articles is provided with a housing containing a heating structure as well as a feed and a discharge between which a track extends for moving the articles through the furnace. The heating structure comprises at least one source which emits radiation having a wavelength located in the range of light radiation, such as an infrared source, and the track for moving the articles comprises a material transparent to light radiation.

25 Claims, 3 Drawing Sheets

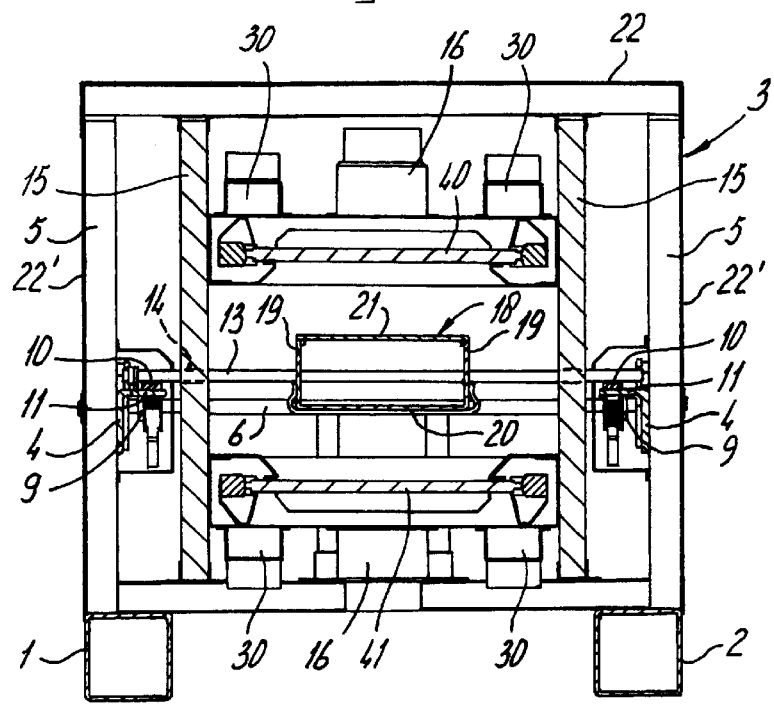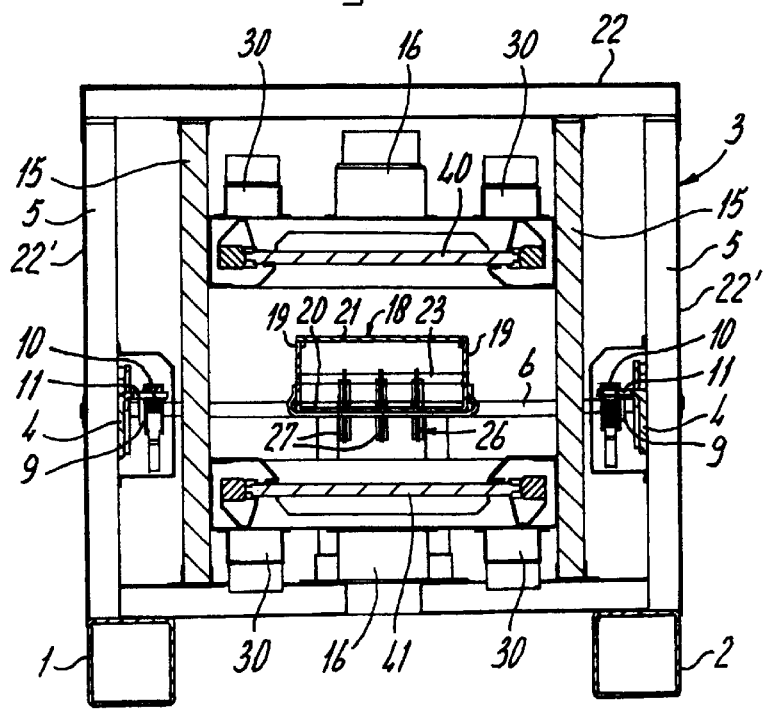

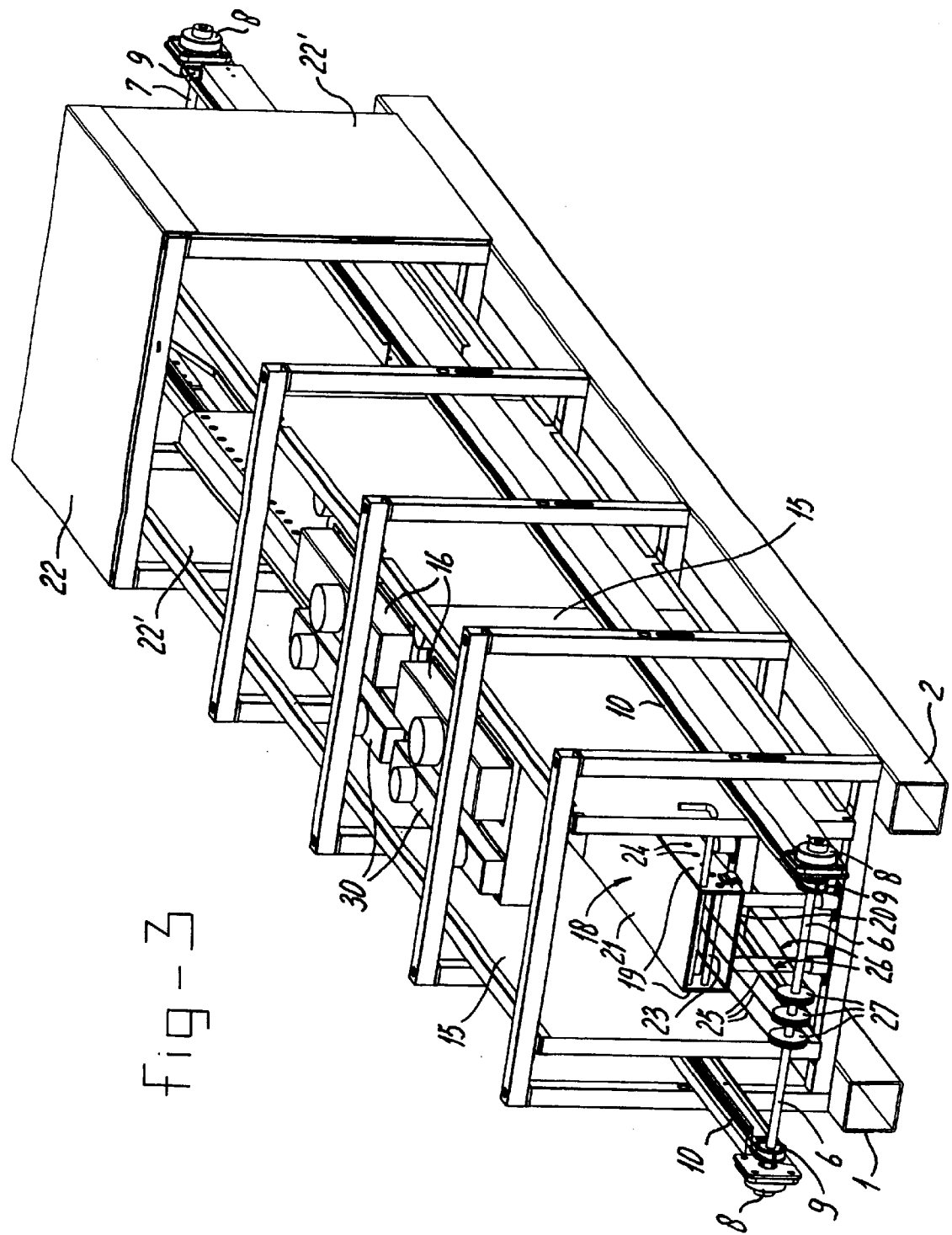

FURNACE FOR THE PRODUCTION OF SOLAR CELLS

The invention relates to a furnace for heating articles, provided with a housing containing heating means as well as a feed and a discharge between which a track extends for moving the articles through the furnace.

The furnace according to the invention is in particular of the type that is used for the production of solar cells. As is customary, to this end a starting material in the form of silicon wafers is first provided with a layer of fluid that contains 50% phosphoric acid. The wafers pre-treated in this way are heated in the furnace by means of convection heating.

The known furnace has a metal conveyor belt, which is subjected to severe stress from the thermal standpoint during this process. The consequence is that the conveyor belt is susceptible to malfunction and has to be replaced relatively frequently. Considerable heat loss also takes place if the return section is fed outside the housing.

The aim of the invention is to provide a furnace which does not have these disadvantages and consequently is able to guarantee production free from breakdowns. Said aim is achieved in that the heating means comprise at least one source which emits radiation having a wavelength located in the range of light radiation, such as an infrared source, and in that the track for moving the articles comprises a material transparent to light radiation.

According to the invention a light source, such as an infrared source, is used for heating. The wavelength of the light concerned can be matched to the colour of the product to be heated, such that the desired absorption for heating the product takes place. Such heating by an infrared source is highly effective for heating the predominantly grey silicon wafers.

However, the track itself is not heated by the light radiation, as a result of which the thermal stress remains very limited and the construction is relatively simple, certainly compared with conventional conveyor belts.

At least one section of the track is accommodated in a tunnel made of quartz plates. By means of such a tunnel, heating is concentrated in the chamber where the products to be heated are located.

The tunnel can be constructed in various ways. Preferably the tunnel has two vertical longitudinal walls and two horizontal longitudinal walls.

The furnace housing comprises an insulating material. In particular the housing comprises a top wall and bottom wall running in the longitudinal direction, the top wall and/or bottom wall having at least one heating source and ventilation device.

The track can be constructed in various ways. According to a first possibility, the track comprises a number of transport rollers made of a material transparent to the light radiation, which transport rollers are placed transversely one after the other in the transport direction and can be driven in the direction of rotation.

The transport rollers can be constructed and used in various ways. According to a first possibility both ends of the transport rollers are fed through the housing to the outside, the ends fed out of the housing being rotatably supported.

In this case the support and drive for the transport rollers are located outside the hot, interior region of the furnace.

In particular, both ends of the transport rollers can each have been placed on a transport element in belt form, which transport elements can be driven counter to the direction of transport in order to cause the transport rollers to rotate by friction.

The transport elements can each comprise an endless belt which is guided over supporting wheels such that the transport rollers are supported on the upper part of each belt.

The ends of the transport rollers fed outside the furnace are retained to prevent movement in the direction of transport.

In order to be able accurately to adjust the transport rollers at right angles to the direction of transport, they are preferably retained between pins, each of which can be turned about an eccentric axis transverse to the axis of each transport roller.

In order to prevent light passing from the housing to the outside via the transport rollers, the transport rollers are each provided close to their ends with a surface region which is diffuse to light radiation. The end faces of the transport rollers can also have been provided with a reflecting layer. The transport rollers are preferably made of quartz.

According to a second possibility the track comprises a number of supports which are positioned one after the other in the direction of transport and are supported in the vertical longitudinal walls of the tunnel. In this case a flexible endless transport element is guided over the supports. Said transport element can comprise at least two flexible cords or belts.

The products are now transported through the tunnel by means of the cords or belts, the supports ensuring that said cords or belts are supported.

The supports preferably consist of quartz rods. In order to prevent the emergence of light, the rods can each have been provided close to their ends with a surface region diffuse to light radiation. The rods can also have been provided with a reflecting layer on their end faces.

The invention will be explained in more detail below with reference to the illustrative embodiments of the furnace shown in the figures.

FIG. 2 shows a cross-section of the furnace according to FIG. 1.

FIG. 3 shows a second embodiment, in a partially exposed and perspective view, of the furnace according to the invention.

FIG. 4 shows a cross-section of the furnace according to FIG. 3.

Figure 1:
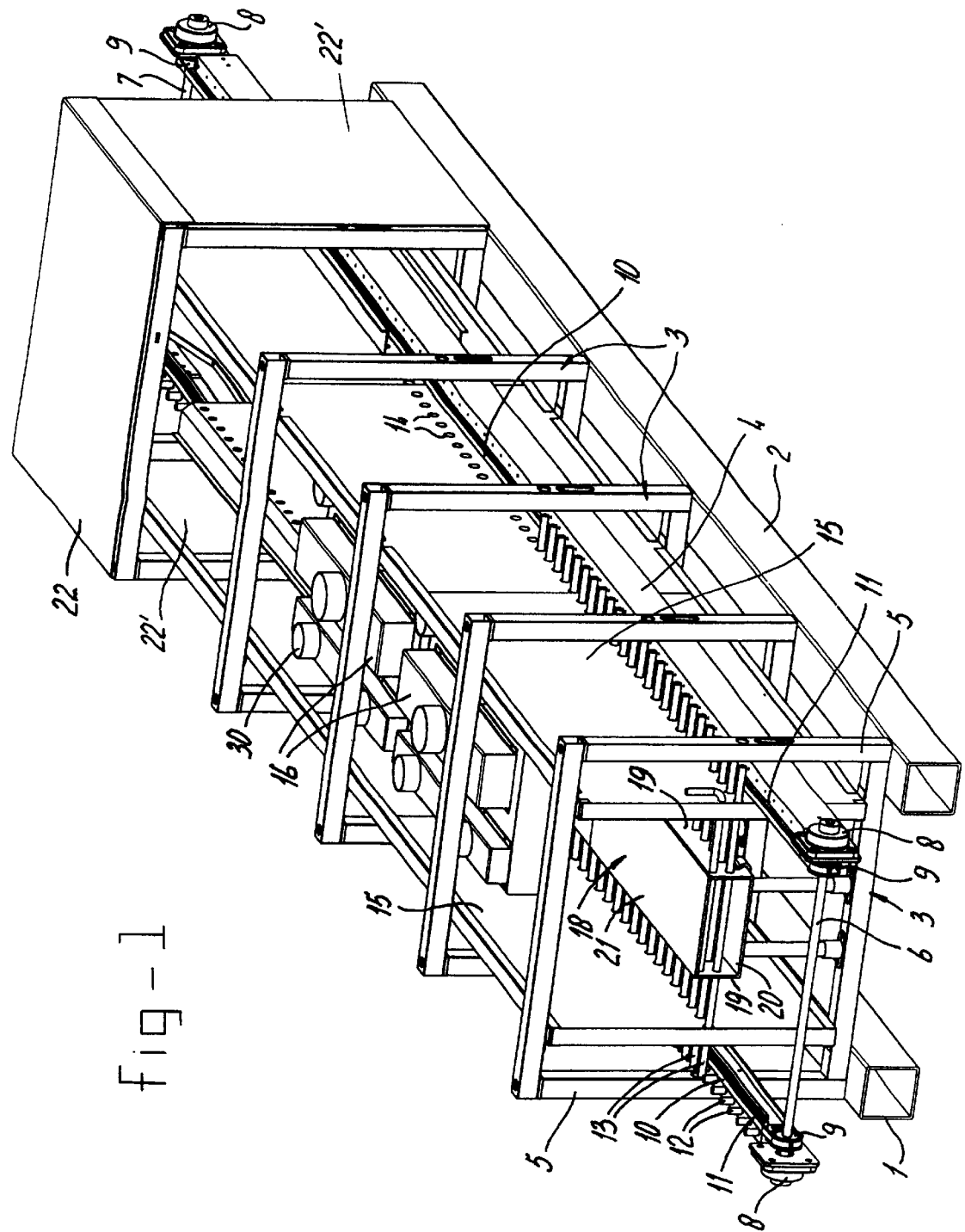
FIG. 1 shows a partially exposed perspective view of a first embodiment of the furnace.

The furnace shown in FIGS. 1 and 2 comprises a frame of longitudinal beams 1, 2, on which a number of frame sections 3 positioned one after the other have been accommodated. Said frame sections 3 bear two support sections 4, which are attached to the legs 5 of each frame window 3. The sections 4 are of L-shaped cross-section.

A rotary shaft 6, which is mounted by means of bearings 8, is attached to the front and the rear end of the sections 4 in the direction of transport. Each shaft 6, 7 also has two pulleys 9.

A flexible endless belt 10, which is supported on the upper, horizontal flange 11 of each of the sections 4, is guided over each pair of pulleys on the shafts 6, 7.

A series of pins 12 is accommodated on each horizontal flange 11, specifically on the outside of the flexible belts 10 (the series on the right-hand side has been omitted for clarity). In each case, one end of the transport rollers 13 is accommodated between every pair of pins 12. Said transport rollers 13 bear on the top of the flexible belts 10.

As soon as the flexible belts 10 are driven synchronously, the transport rollers 13 are also driven in the direction of rotation by virtue of their frictional interaction with the conveyor belts 10. The transport rollers 13 remain in place in the direction of transport, since their two ends are accommodated between the pins 12.

The transport rollers 17 are fed through the holes 14 in the vertical walls 15 of the furnace. The heating devices 16, which, for example, can be infrared heating devices, are located between said walls.

To prevent the transport rollers 13 being heated by the infrared heating devices 16, the transport rollers 13 are made of a quartz material. Said quartz material is transparent with respect to the infrared radiation of the heating devices 16, as a result of which no heating takes place.

In order to prevent the infrared radiation passing via the transport rollers to the outside, the transport rollers are provided close to their ends with a diffuse or matt peripheral section. A reflecting surface can also be provided in these locations.

A tunnel 18 made up of quartz plates extends through the furnace. Said tunnel 18 has two side walls 19, a bottom wall 20 and a top wall 21. The products to be heated are fed through the tunnel on the transport rollers. Since the walls 19–21 of the tunnel 18 are made of quartz, the infrared radiation supplied by the heating devices 16 is able to enter the tunnel 18. During this operation the products are uniformly heated. Furthermore, the heating devices 16 can have been arranged both at the top and at the bottom of the tunnel 18. Ventilation devices 30 are also provided to circulate the air in the furnace.

Finally, the outside of the furnace is clad with cladding plates 22, 22', some of which are shown in FIG. 1.

The transport rollers can also be driven individually, for example by means of gears.

The construction of the furnace according to FIGS. 3 and 4 is in broad terms identical to that in FIGS. 1 and 2. Only the transport means and the drive thereof differ from those according to FIGS. 1 and 2. The transport means comprise fixed rods 23 which extend only in the tunnel 18 but not outside this. They are fixed in the holes 24 of the side walls 19 of the tunnel 18. The upper part 25 of the transport cords or belts 26 can be moved over the transport rollers 23.

Close to the two ends of the furnace, said transport cords or belts are guided round pulleys 27 which are mounted on the shafts 6, 7. The rotation of said shafts 6, 7 is synchronised by means of the flexible belts 10.

As shown in FIG. 4, the pulleys 27 are offset slightly downwards, so that the upper parts 25 of the transport cords or belts 26 lie taut over the rods 23.

The products are now fed through the furnace on the transport cords or belts 26. With this arrangement said transport cords or belts 26 are supported by the rods 23.

What is claimed is:

1. Furnace for heating articles, provided with a housing containing heating means (16) as well as a feed and a discharge between which a track (13, 23, 25) extends for moving the articles through the furnace, the heating means (16) comprising at least one source which emits radiation having a wavelength located in the range of light radiation, such as an infrared source, wherein the track comprises a number of transport rollers (13, 23) made of a material transparent to the light radiation, which transport rollers are placed transversely one after the other in the transport direction and both ends of the transport rollers (13) are fed through the housing to the outside and the transport rollers are rotatably supported at their ends fed outside the housing.

2. Furnace according to claim 1, wherein the track is at least partially accommodated in a tunnel (18) made of quartz material (19, 21).

3. Furnace according to claim 2, wherein the tunnel has two vertical longitudinal walls (19) and two horizontal longitudinal walls (20, 21).

4. Furnace according to claim 3, wherein the tunnel (18) extends through the entire housing.

5. Furnace according to claim 1, wherein the furnace housing comprises insulating material.

6. Furnace according to claim 5, wherein the housing has a top wall (40) and bottom wall (41) running in the longitudinal direction.

7. Furnace according to claim 6, wherein the top wall (40) and/or bottom wall (41) has at least one heating source (16).

8. Furnace according to claim 6, wherein the top wall (40) and/or bottom wall (41) contains at least one ventilation device (30).

9. Furnace according to claim 5, wherein the housing comprises two side walls (15), made of insulating material, running in the longitudinal direction.

10. Furnace according to claim 1, wherein both ends of the transport rollers (13) are each placed on a transport element (10) in belt form, which transport elements can be driven counter to the direction of transport in order to cause the transport rollers (13) to rotate by friction.

11. Furnace according to claim 10, wherein the transport elements each comprise an endless belt (10), which is guided over supporting wheels (9), and the transport rollers (13) are supported on the top part of each belt (10).

12. Furnace according to claim 11, wherein the ends of the transport rollers (13) fed outside the furnace are retained (12) to prevent movement in the direction of transport.

13. Furnace according to claim 12, wherein the transport rollers are retained between pins (12), each of which can be turned about an eccentric axis transverse to the axis of each transport roller (13).

14. Furnace according to claim 1, wherein the transport rollers (13) are provided with a support ring at the ends fed outside the housing.

15. Furnace according to one of claim 1, wherein the transport rollers (13) are provided with a reflecting layer on their end faces.

16. Furnace according to claim 1, wherein the transport rollers (13) are each provided close to their ends with a surface region (17) which is diffuse to light radiation.

17. Furnace according to one of claim 3, wherein the track comprises a number of supports which are positioned one after the other in the direction of transport and are supported in the vertical longitudinal walls (19) of the tunnel (18).

18. Furnace according to claim 17, wherein a flexible endless transport element (25) is movably guided over the supports (23).

19. Furnace according to claim 18, wherein the transport element (25) comprises at least two flexible cords or belts.

20. Furnace according to claim 18, wherein the transport element (25) is guided around a return roller (27) at the two ends of the furnace.

21. Furnace according to one of claim 17, wherein the supports (13, 23) consist of quartz rods.

22. Furnace according to claim 21, wherein the rods (13, 23) are each provided close to their ends with a surface region (17) diffuse to light radiation.

23. Furnace according to claim 21, wherein the rods are provided with a reflecting layer on their end faces.

24. Furnace for heating articles, provided with a housing containing heating means (16) as well as a feed and a discharge between which a track (13, 23, 25) extends for moving the articles through the furnace, the heating means (16) comprising at least one source which emits radiation having a wavelength located in the range of light radiation, such as an infrared source, wherein the track comprises a number of transport rollers (13, 23) made of a material transparent to the light radiation, which transport rollers are placed transversely one after the other in the transport direction and the transport rollers (13) are each provided close to their ends with a surface region (17) which diffuses light radiation.

25. Furnace for heating articles, provided with a housing containing heating means (16) as well as a feed and a discharge between which a track (13, 23, 25) extends for moving the articles through the furnace, the heating means (16) comprising at least one source which emits radiation having a wavelength located in the range of light radiation, such as an infrared source, wherein the track comprises a number of transport rollers (13, 23) made of a material transparent to the light radiation, which transport rollers are placed transversely one after the other in the transport direction and the transport rollers (13) are provided with a reflecting layer on their end faces.

* * * * *